(12) United States Patent
Zhu et al.

(10) Patent No.: US 8,249,847 B2
(45) Date of Patent: Aug. 21, 2012

(54) SIMULATION SYSTEM AND METHOD FOR MANUFACTURING PRINTED CIRCUIT BOARD

(75) Inventors: Jin Zhu, Shenzhen (CN); Ming Wang, Shenzhen (CN); Chih-Yi Tu, Taoyuan (TW)

(73) Assignees: FuKui Precision Compnent (Shenzhen) Co., Ltd., Shenzhen, Guangdong Province (CN); Zhen Ding Technology Co., Ltd., Tayuan, Taoyuan (TW)

( * ) Notice: Subject to any disclaimer, the term of this patent is extended or adjusted under 35 U.S.C. 154(b) by 237 days.

(21) Appl. No.: 12/045,137

(22) Filed: Mar. 10, 2008

(65) Prior Publication Data

US 2009/0088881 A1    Apr. 2, 2009

(30) Foreign Application Priority Data

Sep. 28, 2007    (CN) .......................... 2007 1 0201893

(51) Int. Cl.
 *G06F 17/50*    (2006.01)
(52) U.S. Cl. ................. 703/14; 703/22; 700/97
(58) Field of Classification Search .............. 700/95, 700/97, 108–110, 117, 121; 716/1, 4–6, 716/8–12, 15; 703/1, 6, 7, 13, 14, 22
 See application file for complete search history.

(56) References Cited

U.S. PATENT DOCUMENTS

| | | | | |
|---|---|---|---|---|
| 5,230,932 A * | 7/1993 | Chen et al. | ..................... | 428/607 |
| 5,250,363 A * | 10/1993 | Chen | ............... | 428/607 |
| 5,350,621 A * | 9/1994 | Yuhas et al. | ................... | 428/209 |
| 5,464,658 A * | 11/1995 | Yuhas et al. | ................ | 427/385.5 |
| 5,496,432 A * | 3/1996 | Sumi et al. | ..................... | 156/706 |
| 5,539,652 A * | 7/1996 | Tegethoff | ........................... | 716/4 |
| 5,706,477 A | 1/1998 | Goto | | |
| 6,113,724 A * | 9/2000 | Ogawa | ........................... | 156/212 |
| 6,496,957 B1 * | 12/2002 | Kumagai | ............................ | 716/4 |
| 6,498,999 B1 | 12/2002 | Reise | | |
| 6,530,069 B2 * | 3/2003 | Jennion et al. | .................... | 716/15 |
| 6,584,436 B2 * | 6/2003 | Hellestrand et al. | ............ | 703/22 |
| 6,629,294 B2 * | 9/2003 | Van Stralen | ....................... | 716/4 |
| 6,658,375 B1 | 12/2003 | McQuarrie et al. | | |
| 7,127,382 B2 * | 10/2006 | Kikuchi et al. | .................... | 703/6 |
| 7,148,503 B2 * | 12/2006 | Fujimura et al. | ................. | 257/48 |
| 7,227,268 B2 * | 6/2007 | Chang et al. | ................... | 257/786 |
| 7,319,944 B2 * | 1/2008 | Nakamura et al. | ................. | 703/6 |
| 2002/0103555 A1 | 8/2002 | Wallace, Jr. | | |
| 2003/0023418 A1 * | 1/2003 | Kikuchi et al. | .................... | 703/6 |
| 2004/0236548 A1 * | 11/2004 | Nakamura et al. | ................. | 703/2 |

FOREIGN PATENT DOCUMENTS

CN    1991786 A    7/2007

* cited by examiner

*Primary Examiner* — Charles Kasenge
(74) *Attorney, Agent, or Firm* — Altis Law Group, Inc.

(57) ABSTRACT

An exemplary simulation system for manufacturing a printed circuit board is provided. The simulation system includes at least one simulation sub-system. The simulation sub-system includes an input module, a storing module, a processing module, and an output module. The input module is configured for acquiring a number of processing parameters associated with steps of a process for manufacturing the printed circuit board. The storing module is configured for storing a number of simulation functions relating to the steps of the process for manufacturing the printed circuit board. The processing module is configured for selecting and performing the corresponding simulation function according to the acquired parameters, thereby obtaining a simulation result. The output module is configured for output the simulation result.

18 Claims, 4 Drawing Sheets

SIMULATION SYSTEM AND METHOD FOR MANUFACTURING PRINTED CIRCUIT BOARD

BACKGROUND

1. Technical Field

The present invention relates to printed circuit boards, particularly to a simulation system and a method for manufacturing a printed circuit board.

2. Description of Related Art

In recent years, printed circuit boards (PCBs) are widely used in electronic devices. In some electronic devices, the printed circuit boards not only act as conductive bodies for maintaining electrical connections among a number of electronic components, but also act as supporting bodies for retaining electronic components with their mechanical strength.

Generally, a printed circuit board is manufactured using a series of steps including drilling holes in a circuit substrate, forming electrical traces on the circuit substrate, electroplating copper on sidewalls of the holes and gold on terminals of the electrical traces, coating a protective film on the circuit substrate, inspecting electrical connection and external appearance, and so on. Forming electrical traces on the circuit substrate further includes the steps of laminating a photoresist layer on a conductive layer of the circuit substrate, exposing the photoresist layer, developing the photoresist layer to form a patterned photoresist layer, etching the conductive layer and removing the patterned photoresist layer. In the steps of the process for manufacturing the printed circuit board, a number of processing parameters are introduced to control the quality of the printed circuit board. Therefore, performance of the printed circuit board manufactured relates directly to the parameters.

In order to develop a new type printed circuit board or improve a present printed circuit board, it is necessary for technicians to do many experiments to find out some optimum processing parameters for manufacturing the printed circuit board. Thus, a lot of material, time, and labor are consumed. As a result, the development of the new types of printed circuit boards and the improvement of existing printed circuit boards is slow and costly.

What is needed, therefore, is a simulation system and a method for manufacturing a printed circuit board, thereby facilitating improvement and development of printed circuit boards.

SUMMARY

One present embodiment provides a simulation system for manufacturing a printed circuit board. The simulation system includes at least one simulation sub-system. The simulation sub-system includes an input module, a storing module, a processing module, and an output module. The input module is configured for acquiring a number of processing parameters associated with steps of a process for manufacturing the printed circuit board. The storing module is configured for storing a number of simulation functions relating to the steps of the process for manufacturing the printed circuit board. The processing module is configured for selecting and performing the corresponding simulation functions according to the acquired parameters, thereby obtaining a simulation result. The output module is configured for outputting the simulation result.

Another present embodiment provides a simulation method for manufacturing a printed circuit board. In the method, firstly, a number of processing parameters associated with steps of a process for manufacturing the printed circuit board are acquired. Secondly, at least one of a plurality of stored simulation functions relating to the steps of the process for manufacturing the printed circuit board is selected. Thirdly, the at least one of the simulation functions is performed according to the acquired parameters, thereby obtaining a simulation result. Fourthly, the simulation result is output to a user.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Embodiments will now be described in detail below and with reference to the drawings.

Figure 1:
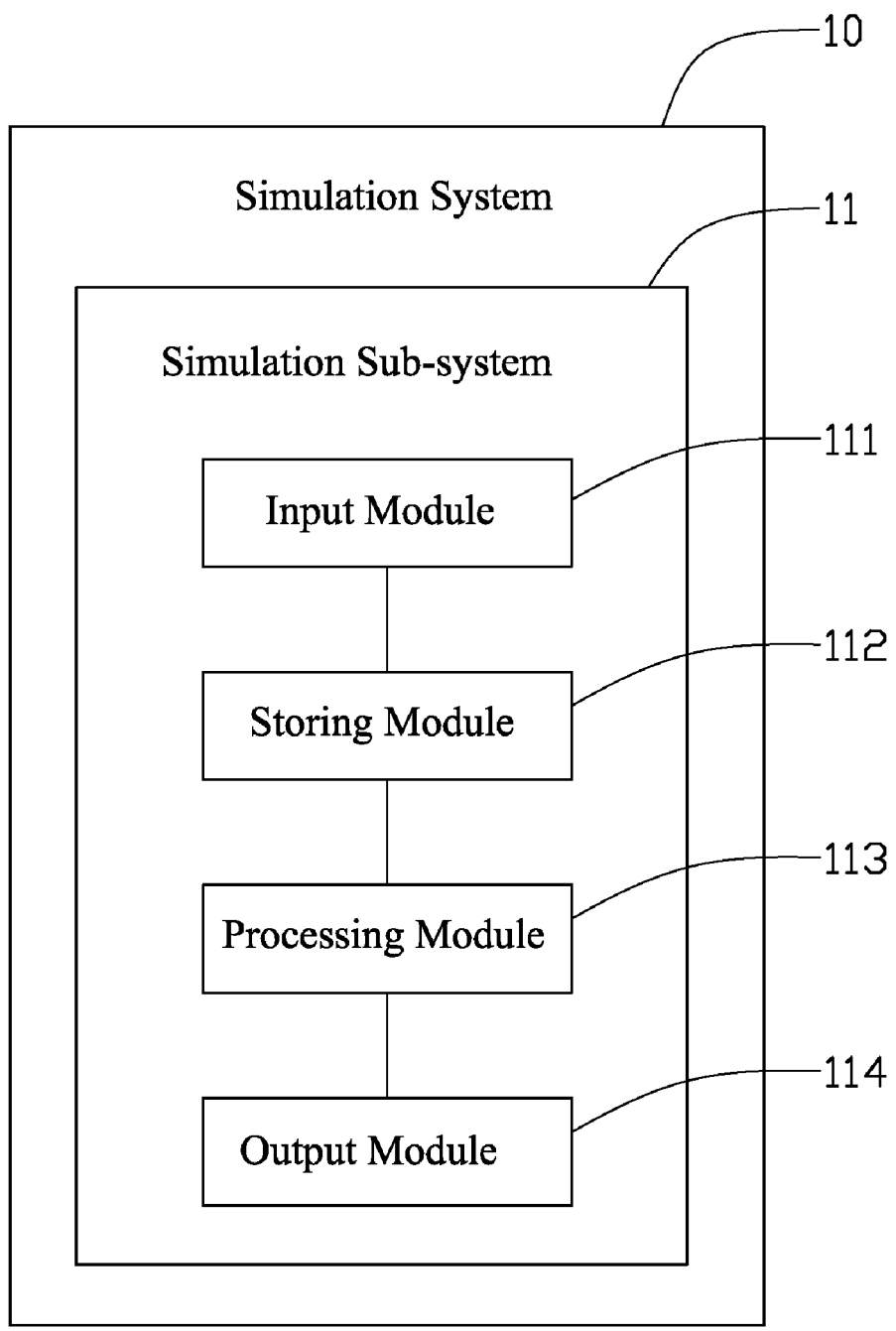
FIG. 1 is a schematic view of a number of functional modules of a simulation system according to a first embodiment.

Referring to FIG. 1, an exemplary simulation system 10 for manufacturing a printed circuit board according to a first embodiment is shown. The simulation system 10 is constructed with one or more computers. The simulation system 10 can simulate either one step or a series of steps of a process for manufacturing the printed circuit board. For example, the one step simulated by the simulation system 10 can be a step of laminating a photoresist layer on a conductive layer of a circuit substrate, or a step of electroplating copper on sidewalls of the holes. For another example, the series of steps of a process of forming electrical traces simulated by the simulation system 10 may include laminating a photoresist layer on a conductive layer of a circuit substrate, exposing the photoresist layer, developing the photoresist layer to form a patterned photoresist layer, etching the conductive layer of the circuit substrate and removing the patterned photoresist layer.

In the first embodiment, the simulation system 10 includes a simulation sub-system 11. The simulation sub-system 11 includes an input module 111, a storing module 112, a processing module 113, and an output module 114.

The input module 111 is configured for acquiring data. The data are a number of processing parameters associated with one or more steps of a process for manufacturing the printed circuit board. For example, the processing parameters can be selected from a group consisting of processing material parameters, apparatus parameters, and circumstance parameters. The processing material parameters include a size of the processing material, a component of the processing material, a concentration of the processing material, and so on. The apparatus parameters include a wearing situation, a stabilization cycle, and so on. The circumstance parameters include a temperature, a pressure, a time, a speed, and so on. All the processing parameters can be input into the input module 111 through a human-computer interface by a user.

The storing module 112 is configured for storing a number of simulation functions. Each of the simulation functions can either relate to one step of the process for manufacturing the printed circuit board or correspond to a number of successive steps of the process for manufacturing the printed circuit board. The storing module 112 can either be a semiconductor/solid state memory or a magnetic memory.

Each of the simulation functions represents a functional relationship between the processing parameters of manufacturing the printed circuit board and the result parameters of the printed circuit board. The result parameters of the printed circuit board include a number of performance parameters and a number of structure parameters. For example, an adhesion force of a photoresist layer and a circuit substrate, a size of the manufactured printed circuit board, a thickness of the copper foil, a line pitch and a line width of the electrical traces, and so on, are the result parameters of the printed circuit board. That is, the simulation function may simulate a functional relationship between the processing parameters of one step of the process of manufacturing the printed circuit board and the result parameters of the printed circuit board that undergoes the one step. The simulation function also may simulate a functional relationship between the processing parameters of a number of successive steps of the process of manufacturing the printed circuit board and the result parameters of the printed circuit board that undergoes the successive steps. The simulation function can be deduced using physical and mathematical theories. The simulation function can also be obtained by experience.

Advantageously, the simulation system 10 further includes an analyzing module and a function transmitting module. The analyzing module is configured for automatically generating a suitable simulation function according to many simulation experiment results. The function transmitting module is configured for selecting the generated simulation function from the analyzing module to transmit to the storing module 112. The storing module 112 communicates with the analyzing module and the function transmitting module so that the simulation functions stored in the storing module 112 can be updated synchronously according to many simulation experiment results.

The processing module 113 is configured for selecting and performing the corresponding simulation function according to the acquired processing parameters, thereby obtaining a simulation result. The processing module 113 can be a central processing unit (CPU).

The output module 114 is configured for obtaining a simulation result from the processing module 113 and outputting the simulation result. The simulation result is a measurement of a number of performance parameters of the simulated manufactured printed circuit board. Thus, performance of the printed circuit board using the processing parameters can be known by simulation.

Figure 2:
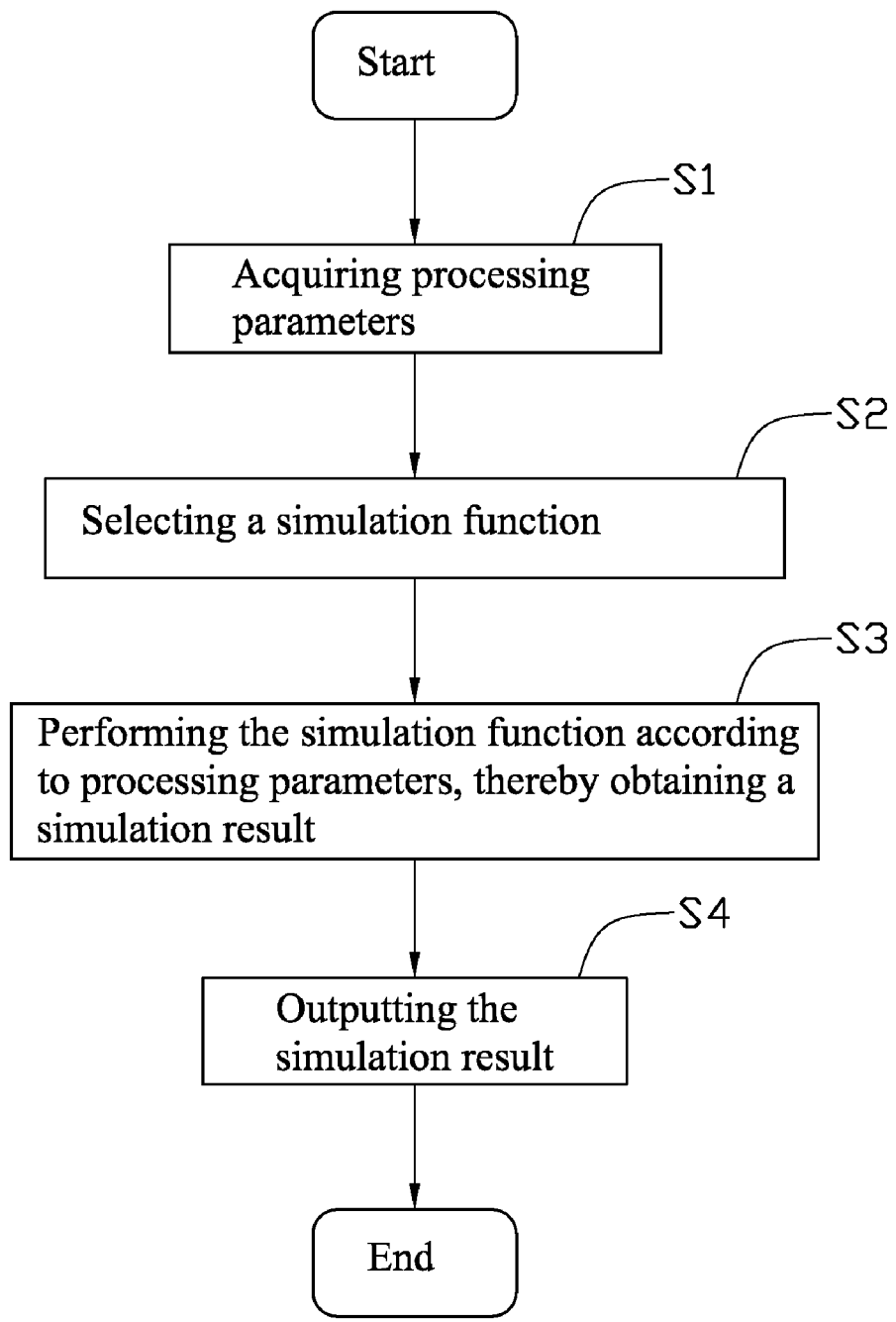
FIG. 2 is a flow chart of a simulation method using the simulation system shown in FIG. 1.

Referring to FIG. 2, a simulation method for manufacturing a printed circuit board using the simulation system 10 includes the following steps. In order to explain the simulation method, a simulation of a process of laminating a photoresist layer on a conductive layer of a circuit substrate will be described using the simulation system 10.

Step S1: a number of processing parameters associated with one step of the process for manufacturing the printed circuit board are acquired using the input module 111I In the present embodiment, the step of laminating the photoresist layer on the conductive layer of the circuit substrate is simulated. The processing parameters of the laminating step include a temperature of a thermally laminating roller (represented by $T_1$), a pressure of the thermally laminating roller (represented by P), a transmitting speed of the substrate (represented by V), and a surface temperature of the circuit substrate (represented by $T_2$). All the processing parameters are input into the input module 111 through the human-computer interface by the user.

Step S2: at least one of a number of stored simulation functions relating to the one step of the process for manufacturing the printed circuit board is selected from the storing module 112.

The simulation functions relating to the one step of the process for manufacturing the printed circuit board are stored in the storing module 112. Generally, each step of the process for manufacturing the printed circuit board has its particular processing parameters. In the present embodiment, a particular range of each of the parameters T1, T2, V, P, can determine the laminating process. Wherein, T1 is a first temperature in degrees Celsius used in the laminating process, T2 is a second temperature in degrees Celsius used in the laminating process, V is velocity of throughput of the printed circuit board in the laminating process, and P is pressure in Pascals for attachment of laminate during the lamination process. For example, in the process of laminating the photoresist layer on the conductive layer of a circuit substrate, $T_1$ is generally in a range from 100 to 140 Celsius degrees, $T_2$ is generally in a range from 35 to 65 Celsius degrees, V is generally in a range from 1.5 to 2.5 meter per minute, and P is generally in a range from 100000 to 300000 Pascals. In other words, when such parameters $T_1$, $T_2$, V, P are input into the storing module 112, the simulation function relating to the step of laminating the photoresist layer on the conductive layer of a circuit substrate is selected. The performance parameters of the printed circuit board laminated with the photoresist layer include an adhesion force of the photoresist layer (represented by F) and filling performance of the photoresist layer (represented by N). Therefore, in the laminating step, a first simulation function (1) $F=a_1T_1+a_2T_2+a_3P+a_4V$ and a second simulation function (2) $F=b_1T_1+b_2T_2+b_3P+b_4V$ can be selected from the storing module 112. In the simulation function (1) and (2), $a_1$, $a_2$, $a_3$, $b_1$, $b_2$, and $b_3$ are all positive constants, and $a_4$ and $b_4$ are negative constants.

Additionally, a suitable simulation function can be generated automatically according to many simulation experiment results using the analyzing module. Moreover, the simulation function generated by the analyzing module can be selected using the function transmitting module to transmit to the storing module 112 to be stored. Thus, the simulation functions (1) and (2) stored in the storing module 112 can be updated synchronously according to many simulation experiment results.

Step S3: the at least one of the simulation functions is performed according to the processing parameters using the processing module 113, thereby obtaining a simulation result.

In the present embodiment, the processing module 113 acquires the processing parameters including $T_1$, P, $T_2$ and V from the input module 111 and selects the two simulation functions (1) and (2) from the storing module 112. According to the processing parameters $T_1$, P, $T_2$ and V, the two simulation functions (1) and (2) are performed. Thus, two simulation values of the performance parameters F and N of the printed circuit board laminated with the photoresist layer can be calculated, thereby obtaining a simulation result of the laminating step.

Step S4: the simulation result is output using the output module 114 to the user.

In the present embodiment, the simulation result is output by the output module 114 and displayed on a screen. According to the simulation result, the user can know the relationship between the processing parameters and the performance of the printed circuit board laminated with the photoresist layer. The optimum processing parameters can be obtained after the laminating process is simulated many times using the simulation system 10.

Figure 3:
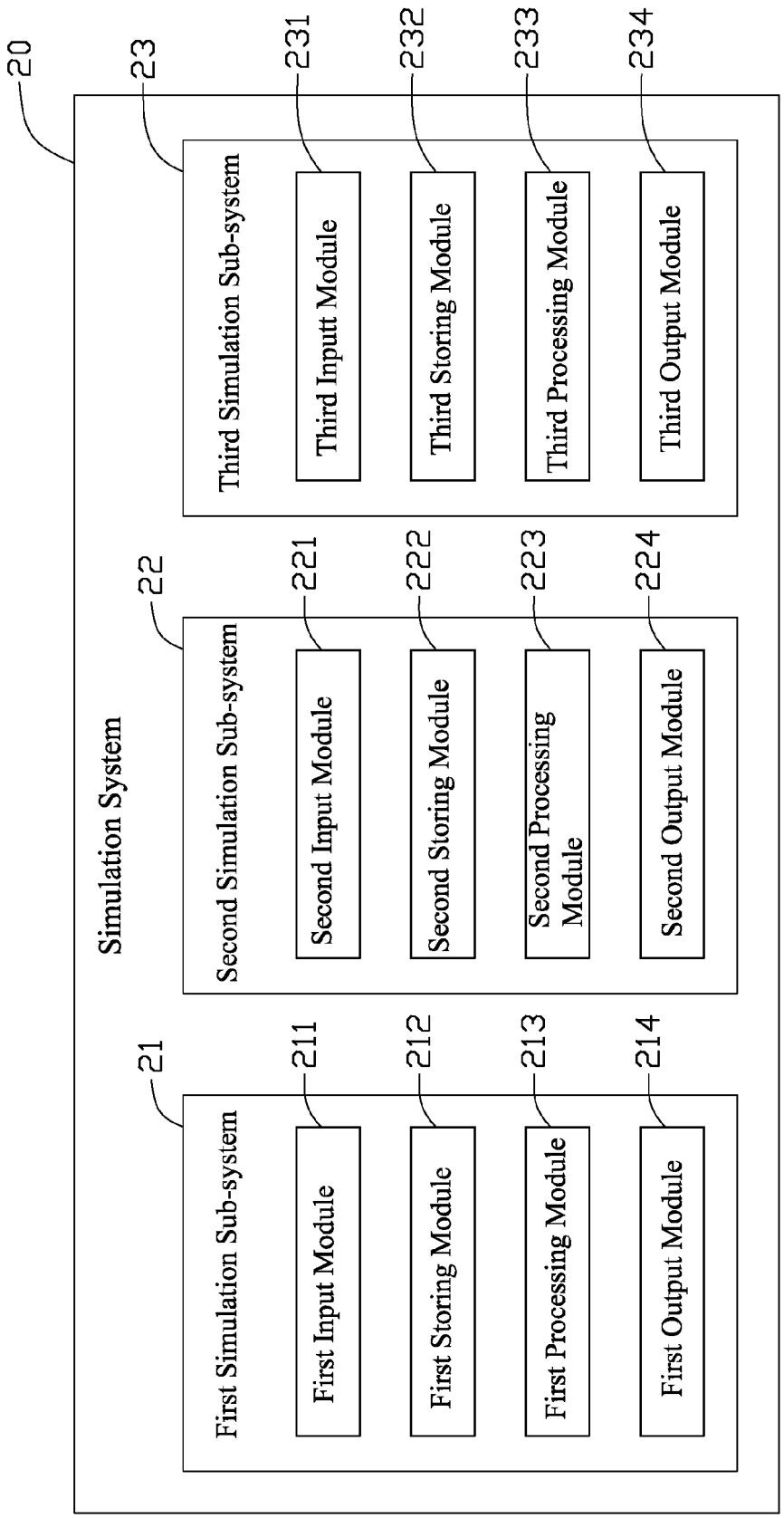
FIG. 3 is a schematic view of a number of functional modules of a simulation system according to a second embodiment.

Referring to FIG. 3, an exemplary simulation system 20 for manufacturing a printed circuit board according to a second embodiment is shown. The simulation system 20 includes a number of simulation sub-systems. Each of the simulation sub-systems can simulate a number of steps of the process for manufacturing the printed circuit board. In the present embodiment, the simulation system 20 includes a first simulation sub-system 21, a second simulation sub-system 22 and a third simulation sub-system 23. The first simulation sub-system 21, the second simulation sub-system 22, and the third simulation sub-system 23 are each similar to the simulation sub-system 11 of the simulation system 10 described in the first embodiment.

The first simulation sub-system 21 includes a first input module 211, a first storing module 212, a first processing module 213, and a first output module 214. The second simulation sub-system 22 includes a second input module 221, a second storing module 222, a second processing module 223, and a second output module 224. The third simulation sub-system 23 includes a third input module 231, a third storing module 232, a third processing module 233, and a third output module 234. The first input module 211, the second input module 221, and the third input module 231 are similar to the input module 111 of the simulation sub-system 11 of the simulation system 10 described in the first embodiment. The first storing module 212, the second storing module 222, and the third storing module 232 are similar to the storing module 112 of the simulation sub-system 11 of the simulation system 10 described in the first embodiment. The first processing module 213, the second processing module 223, and the third processing module 233 are similar to the processing module 113 of the simulation sub-system 11 of the simulation system 10 described in the first embodiment. The first output module 214, the second output module 224, and the third output module 234 are similar to the output module 114 of the simulation sub-system 11 of the simulation system 10 described in the first embodiment.

In the present embodiment, the first input module 211 acquires data through a human-computer interface. The first simulation sub-system 21 simulates a first step of the process for manufacturing the printed circuit board to generate a first simulation result, then, the first simulation result is output using the first output module 214. The second input module 221 acquires data through the human-computer interface and the first simulation result from the first output module 214. The second simulation sub-system 22 simulates a second step of the process for manufacturing the printed circuit board to generate a second simulation result, then, the second simulation result is output using the second output module 224. The third input module 221 acquires data through the human-computer interface and the second simulation result from the second output module 224. The third simulation sub-system 23 simulates a third step of the process for manufacturing the printed circuit board to generate a third simulation result, then the third simulation result is output using the third output module 224. In such fashion, a series of successive steps of the process for manufacturing the printed circuit board can be successively simulated, thereby obtaining a final result of performance parameters of the printed circuit board that undergoes these successive steps. Therefore, the process having a number of steps can be simulated.

It is noted that the first storing module 212, the second storing module 222, and the third storing module 232 share a common storing module pre-storing a number of simulation functions relating to various steps of the process for manufacturing the printed circuit board. It is also noted that the first processing module 213, the second processing module 223, and the third processing module 233 share a common processing module.

Figure 4:
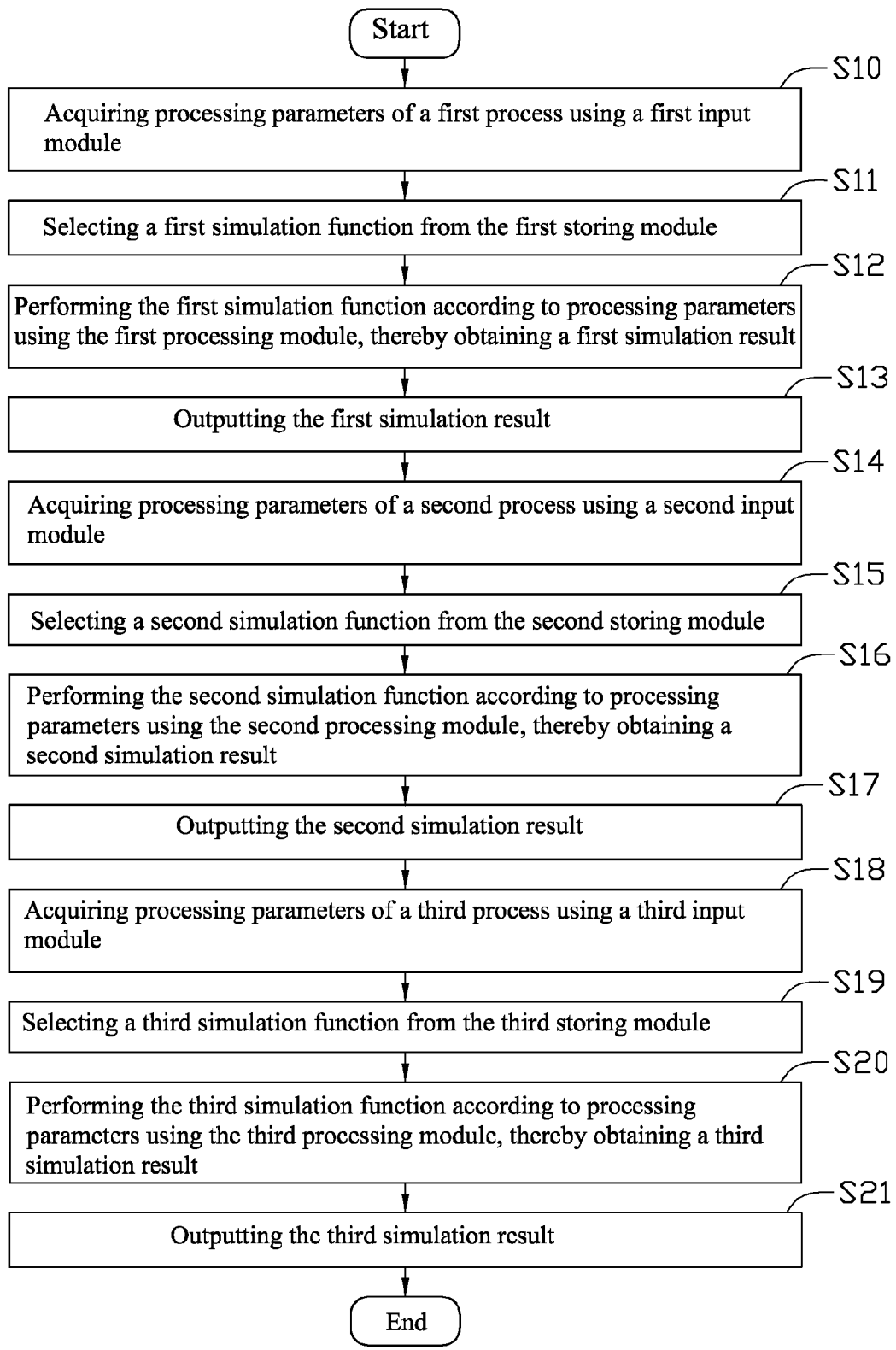
FIG. 4 is a flow chart of a simulation method using the simulation system shown in FIG. 3.

Referring to FIG. 4, a simulation method for manufacturing a printed circuit board using the simulation system 20 includes the following steps. In order to explain the simulation method, a simulation of a series of steps of the process of forming electrical traces of a printed circuit board will be detailed using the simulation system 20, which includes a first step of exposing a photoresist layer coated on a circuit substrate, a second step of developing the photoresist layer to for a patterned photoresist layer, and a third step of etching a conductive layer of the circuit substrate.

Step S10: a number of processing parameters of the first step are acquired using the first input module 211.

In the present embodiment, the first step is an exposing step of forming electrical traces of the printed circuit board, the processing parameters relate to the exposing step. For example, the processing parameters can be an exposing time, an intension of light, and so on.

Step S11: a first simulation function is selected from the first storing module 212.

In the present embodiment, the first simulation function relating to the exposing step of forming electrical traces of the printed circuit board is selected from the first storing module 212. The first simulation function represents a functional relationship between the processing parameters of the exposing step and the performance parameters of the printed circuit board undergoing the exposing step.

Step S12: the first simulation function is performed according to the processing parameters of the first step using the processing module 213, thereby obtaining a first simulation result.

In the present embodiment, according to the processing parameters of the exposing step input from the first input module 211, the first simulation function is performed. Thus, a first simulation value of the performance parameters of the printed circuit board undergoing the exposing step can be calculated, thereby obtaining a first simulation result of the exposing step.

Step S13: the first simulation result is output using the first output module 214.

In the present embodiment, the first simulation result is output by the output module 114 and displayed on a screen. Moreover, the first simulation result can be transmitted to the second input module 221. According to the first simulation result, the user can know the relationship between the processing parameters of the exposing step and the performance of the printed circuit board undergoing the exposing step. The optimum processing parameters of the exposing step can be obtained after the exposing step is simulated many times using the simulation system 20.

Step S14: a number of processing parameters of the second step are acquired using the second input module 211.

In the present embodiment, the second step is a developing step of forming electrical traces of the printed circuit board, the processing parameters relate to the developing step. For example, the processing parameters of the developing step includes a developing time, a concentration of the developing solvent, and the performance parameters of the printed circuit board undergoing the exposing step, and so on. The processing parameters of the developing step such as a developing time and a concentration of the developing solvent are input into the second input module 221 through the human-computer interface. The performance parameters of the printed circuit board undergoing the exposing step are input into the second input module 221 from the first output module 214.

Step S15: a second simulation function is selected from the second storing module 212.

In the present embodiment, the second simulation function relating to the developing step of forming electrical traces of the printed circuit board is selected from the second storing module 222. The second simulation function represents a functional relationship between the processing parameters of the developing step and the performance parameters of the printed circuit board undergoing the developing step.

Step S16: the second simulation function is performed according to the processing parameters of the second step using the processing module 223, thereby obtaining a second simulation result.

In the present embodiment, according to the processing parameters of the developing step acquired by the second input module 221, the second simulation function is performed. Thus, a second simulation value of the performance parameters of the printed circuit board undergoing the exposing and the developing step can be calculated, thereby obtaining a second simulation result comprising the exposing and the developing steps.

Step S17: the second simulation result is output using the second output module 224.

In the present embodiment, the second simulation result is output by the second output module 224 and displayed on the screen. Moreover, the first simulation result can be transmitted to the third input module 231. According to the second simulation result, the user can know the relationship between the processing parameters of the exposing step, the processing parameters of the developing step and the performance of the printed circuit board undergoing the exposing step and the developing step. The optimum processing parameters of the exposing and developing steps can be obtained after the exposing step and the developing step are simulated many times using the simulation system 20.

Step S18: a number of processing parameters of the third step are acquired using the second input module 231.

In the present embodiment, the third step is an etching step of forming electrical traces of the printed circuit board, the processing parameters relates to the etching step. For example, the processing parameters of the etching step includes an etching time, a concentration of the etchant, and the performance parameters of the printed circuit board undergoing the exposing and developing steps, and so on. The processing parameters of the etching step such as an etching time and a concentration of the etchant are input into the third input module 231 through the human-computer interface. The performance parameters of the printed circuit board undergoing the exposing and developing steps are inputted into the third input module 231 from the second output module 224.

Step S19: a third simulation function is selected from the third storing module 232.

In the present embodiment, the third simulation function relating to the etching step of forming electrical traces of the printed circuit board is selected from the third storing module 232. The third simulation function represents a functional relationship between the processing parameters of the etching step and the performance parameters of the printed circuit board undergoing the etching step.

Step S20: the second simulation function is performed according to the processing parameters of the third step using the processing module 223, thereby obtaining a second simulation result.

In the present embodiment, according to the processing parameters acquired by the third input module 231, the third simulation function is performed. Thus, a second simulation value of the performance parameters of the printed circuit board undergoing the exposing, developing and etching steps can be calculated, thereby obtaining a third simulation result comprising the exposing, developing, and etching steps.

Step S21: the third simulation result is output using the third output module 234.

In the present embodiment, the third simulation result is output by the third output module 234 and displayed on the screen. Moreover, the third simulation result is a final simulation result of the series of successive steps of the process of forming electrical traces of the printed circuit board. According to the third simulation result, the user can know the relationship between the processing parameters of the exposing, developing, and etching steps and the performance of the electrical traces of the printed circuit board. The optimum processing parameters of the exposing, developing and etching steps can be obtained after the series of successive steps of the process of forming electrical traces of the printed circuit board are simulated many times using the simulation system 20.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended.

What is claimed is:

1. A simulation system for forming electrical traces of a printed circuit board, the simulation system comprising a first simulation sub-system for simulating a first process of laminating a photoresist layer on a conductive layer of a circuit substrate, the first simulation sub-system, comprising:

a first input module configured for acquiring a plurality of processing parameters associated with the first process inputted through a human-computer interface by a user, the processing parameters associated with the first process selected from a group consisting of a temperature of a thermally laminating roller, a pressure of the thermally laminating roller, a transmitting speed of the circuit substrate, and a surface temperature of the circuit substrate;

a first memory configured for storing a plurality of simulation functions relating to the first process;

a first central processing unit configured for selecting and performing the corresponding simulation function according to the input parameters thereby obtaining a simulation result relating to the first process; and a first output module configured for outputting the simulation result and displaying the simulation result relating to the first process.

2. The simulation system as claimed in claim 1, wherein one of the simulation functions represents a function relationship between the processing parameters of the first process and a plurality of performance parameters of an adhesion force of the photoresist layer laminated to the printed circuit board.

3. The simulation system as claimed in claim 1, further comprising an analyzing module configured for automatically generating a suitable simulation function according to a plurality of simulation results.

4. The simulation system as claimed in claim 3, further comprising a function transmitting module configured for selecting the simulation function generated by the analyzing module and transmitting the selected simulation function to the first memory.

5. The simulation system as claimed in claim 4, wherein the first memory is configured for communicating with the analyzing module and the function transmitting module so that the simulation functions stored in the first memory is updated synchronously.

6. The simulation system as claimed in claim 1, wherein the first memory is either a semiconductor memory or a magnetic memory.

7. The simulation system as claimed in claim 1, further comprising a second simulation sub-system for simulating a second process of exposing the photoresist layer coated on the circuit substrate.

8. The simulation system as claimed in claim 7, wherein the second simulation sub-system comprises:
- a second input module configured for acquiring a plurality of processing parameters associated with the second process inputted through the human-computer by the user;
- a second memory configured for storing a plurality of simulation functions relating to the second process;
- a second central processing unit configured for selecting and performing the corresponding simulation function according to the input parameters thereby obtaining a simulation result relating to the second process; and
- a second output module configured for outputting the simulation result relating to the second process and displaying displaying the simulation result relating to the second process.

9. The simulation system as claimed in claim 8, wherein the processing parameters associated with the second process are selected from a group consisting of an exposing time, an intension of light, and performance parameters of the printed circuit board undergoing the first process.

10. The simulation system as claimed in claim 8, further comprising a third simulation sub-system for simulating a third process of developing the photoresist layer into a patterned photoresist layer.

11. The simulation system as claimed in claim 10, wherein the third simulation sub-system comprising:
- a third input module configured for acquiring a plurality of processing parameters associated with the third process inputted through the human-computer interface by the user;
- a third memory configured for storing a plurality of simulation functions relating to the third process;
- a third central processing unit configured for selecting and performing the corresponding simulation function according to the input parameters thereby obtaining a simulation result relating to the third process; and
- a third output module configured for outputting the simulation result relating to the third process and displaying the simulation result relating to the third process.

12. The simulation system as claimed in claim 11, wherein the processing parameters associated with the third process are selected from a group consisting of developing time, a concentration of the developing solvent, and performance parameters of the printed circuit board undergoing the second process.

13. The simulation system as claimed in claim 11, further comprising a fourth simulation sub-system for simulating a fourth process of etching a conductive layer of the circuit substrate.

14. The simulation system as claimed in claim 13, wherein the fourth simulation sub-system comprises:
- a fourth input module configured for acquiring a plurality of processing parameters associated with the fourth process inputted through a human-computer interface by the user;
- a fourth memory configured for storing a plurality of simulation functions relating to the fourth process;
- a fourth central processing unit configured for selecting and performing the corresponding simulation function according to the input parameters thereby obtaining a simulation result relating to the fourth process; and
- a fourth output module configured for outputting the simulation result relating to the fourth process and displaying the simulation result relating to the fourth process.

15. The simulation system as claimed in claim 14, wherein the processing parameters associated with the fourth process are selected from a group consisting of an etching time, a concentration of the etchant, and performance parameters of the printed circuit board undergoing the third process.

16. A simulation method for forming electrical traces of a printed circuit board, the simulation method comprising:
- a first step for simulating a first process of laminating a photoresist layer on a conductive layer of a circuit substrate, the first step comprising:
  - acquiring a plurality of first processing parameters associated with the first process of laminating a photoresist layer on a conductive layer of a circuit substrate by inputting into a first input module through a human-computer interface;
  - selecting a first simulation function stored in a memory relating to the first process of laminating a photoresist layer on a conductive layer of a circuit substrate through a first central processing unit;
  - performing the first simulation function according to the acquired first processing parameters through the first central processing unit, thereby obtaining a first simulation value of the performance parameters of the printed circuit board laminated with the photoresist layer; and
  - outputting and displaying the first simulation value and displaying the first simulation value on a screen; and
- a second step for simulating a second process of exposing the photoresist layer coated on the circuit substrate, the second step comprising:
  - acquiring a plurality of second processing parameters associated with the second process of exposing the photoresist layer coated on the circuit substrate by inputting into a second input module through a human-computer interface;
  - selecting a second simulation function stored in the memory relating to the second process of exposing the photoresist layer coated on the circuit substrate through a second central processing unit;
  - performing the second simulation function according to the acquired second processing parameters through the second central processing unit, thereby obtaining a second simulation value of the performance parameters of the printed circuit board undergoing the exposing step; and
  - outputting the second simulation value and displaying the second simulation value on a screen.

17. The simulation method as claimed in claim 16, further comprising a third step for simulating a third process of developing the photoresist layer into a patterned photoresist layer, the third step comprising:

acquiring a plurality of third processing parameters associated with the third process of developing the photoresist layer into a patterned photoresist layer by inputting into a third input module through a human-computer interface, and transmitting the second simulation value into the third input module;

selecting a third simulation function stored in the memory relating to the third process of developing the photoresist layer into a patterned photoresist layer through a third central processing unit;

performing the third simulation function according to the acquired third processing parameters through the third central processing unit, thereby obtaining a third simulation value of the performance parameters of the printed circuit board undergoing the exposing step and the developing step; and outputting the third simulation value and displaying the third simulation value on a screen.

18. The simulation method as claimed in claim 17, further comprising a fourth step for simulating a fourth process of etching a conductive layer of the circuit substrate, the fourth step comprising:

acquiring a plurality of fourth processing parameters associated with the fourth process of etching a conductive layer of the circuit substrate by inputting into a fourth input module through a human-computer interface, and transmitting the third simulation value into the fourth input module;

selecting a fourth simulation function stored in the memory relating to the fourth process of etching a conductive layer of the circuit substrate through a fourth central processing unit;

performing the fourth simulation function according to the acquired fourth processing parameters through the fourth central processing unit, thereby obtaining a fourth simulation value of the performance parameters of the printed circuit board undergoing the exposing step, the developing step, and the etching step; and outputting the fourth simulation value and displaying the fourth simulation value on a screen.

* * * * *